United States Patent
Saha et al.

(10) Patent No.: US 7,432,202 B2
(45) Date of Patent: Oct. 7, 2008

(54) METHOD OF SUBSTRATE MANUFACTURE THAT DECREASES THE PACKAGE RESISTANCE

(75) Inventors: Bijay S. Saha, Chandler, AZ (US); Munehiro Toyama, Ibarakiken (JP); Ehab A. Nasir, Mesa, AZ (US); Omar J. Bchir, Chandler, AZ (US); Charavana K. Gurumurthy, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 11/320,273

(22) Filed: Dec. 28, 2005

(65) Prior Publication Data

US 2007/0148971 A1      Jun. 28, 2007

(51) Int. Cl.
    *H01L 21/44* (2006.01)
(52) U.S. Cl. ........................ 438/686; 257/768
(58) Field of Classification Search ........ 257/758, 257/768, 769, 779, 677; 438/575, 580, 586, 438/614, 625, 686, 652
See application file for complete search history.

(56) References Cited

U.S. PATENT DOCUMENTS

| | | | |
|---|---|---|---|
| 4,268,849 A | | 5/1981 | Gray et al. |
| 4,350,990 A | * | 9/1982 | Lo ................... 372/44.01 |
| 5,841,217 A | * | 11/1998 | Kizaki et al. ........... 310/348 |
| 6,759,751 B2 | * | 7/2004 | Sinha ................... 257/779 |
| 2002/0022477 A1 | * | 2/2002 | Vihinen ................. 455/414 |
| 2003/0096495 A1 | * | 5/2003 | Ihara et al. ............. 438/614 |
| 2005/0208747 A1 | * | 9/2005 | Lee et al. ............... 438/612 |
| 2005/0242443 A1 | * | 11/2005 | Kobayashi .............. 257/772 |
| 2005/0280112 A1 | | 12/2005 | Abbott |
| 2006/0102384 A1 | * | 5/2006 | Watanabe et al. ........ 174/256 |
| 2006/0201997 A1 | * | 9/2006 | Tung ..................... 228/101 |

FOREIGN PATENT DOCUMENTS

| | | |
|---|---|---|
| EP | 0234487 | 9/1987 |
| EP | 0245697 | 11/1987 |
| GB | 2186597 | 8/1987 |
| JP | 59143352 | 8/1984 |

OTHER PUBLICATIONS

Bracato, P, et al., "Contact Material," Database Compendex (Online) Engineering Information, Inc., New York, NY, Technol, Amr. 1985, No. 76, p. 9.
Intel Corporation, International Search Report and Written Opinion mailed Jun. 18, 2007, PCT/US2006/047639 filed Dec. 12, 2006.

* cited by examiner

*Primary Examiner*—S. V. Clark
(74) *Attorney, Agent, or Firm*—Blakely, Sokoloff, Taylor & Zafman LLP

(57) ABSTRACT

A method includes forming a coating on a land contact of a package substrate, the coating including a first material disposed between a first layer and a second layer, each of the first layer and the second layer being made of a second material including gold. An apparatus includes a package substrate including a plurality of land contacts wherein each of the plurality of land contacts includes a coating including a first material disposed between a first layer and a second layer, each of the first layer and the second layer being made of a second material including gold.

13 Claims, 2 Drawing Sheets

METHOD OF SUBSTRATE MANUFACTURE THAT DECREASES THE PACKAGE RESISTANCE

FIELD

Integrated circuit packaging.

BACKGROUND

Integrated circuits in the form of a chip or die are typically enclosed by a package that is mounted to a printed circuit board. The package has a number of external contacts on, for example, a land side of a package substrate that are connected to the printed circuit board and dedicated to the various power, ground and signal pins of the integrated circuit. Typical techniques for connecting contacts of a package with contacts of a printed circuit board include solder ball, pin, and socket techniques. In a situation where the contacts are not formed by solder balls that are attached to conductive contacts or lands of the package substrate, a typical package reference is as a land grid array (LGA) package.

A package substrate typically has internal routing layers which connect external lands to contacts on an opposite side of the substrate package that are connected to the integrated circuit chip or die. An internal routing layer typically contains separate layers for a ground bus, a power bus and a plurality of signal lines. The various layers are connected to the external lands by vias that extend through the substrate.

In general, the amount of current required of a die determines a performance of the die. If package resistance is high, current flow in the package will be reduced and the package and die will require more power. If resistance is low, the integrated circuit die can function at a lower power (e.g., 1.3 to 1.5 volts). Thus, one objective is to develop a low resistivity package.

As noted above, a package substrate has multiple conductive layers and power dissipation with respect to these layers is generally minimal. Most of the power dissipation of a substrate package occurs at the contacts or lands. Thus, in one sense, the lands determine the overall resistivity of the package substrate.

According to a current process, the external conductive lands of a package substrate are copper coated structures. For example, a copper contact formed in the substrate package is coated with a layer of nickel, followed by a coating of palladium, followed by a coating of gold.

DETAILED DESCRIPTION

Figure 1:
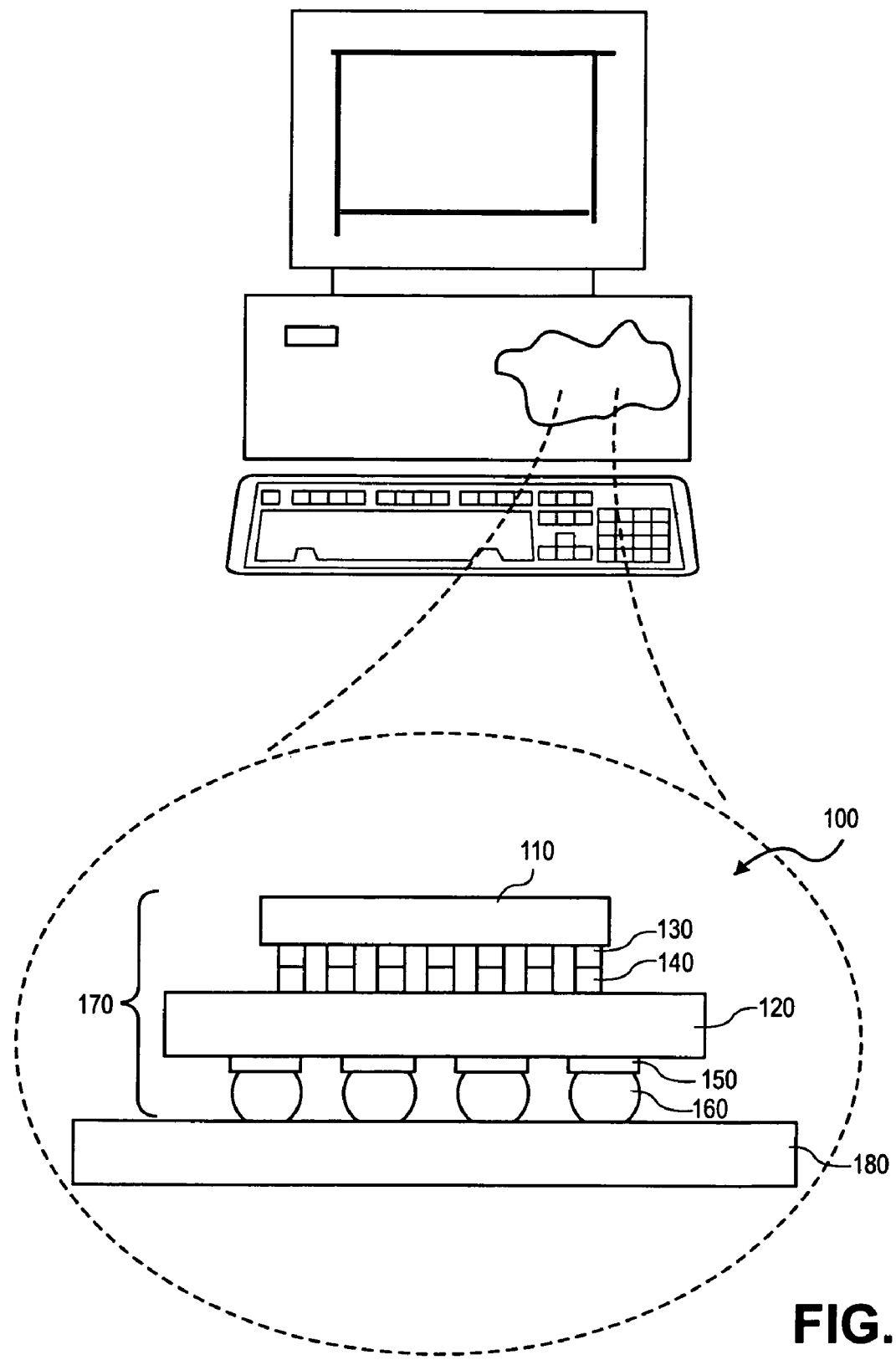
FIG. 1 shows a computer system including microprocessor enclosed by a package mounted to a printed circuit board.

FIG. 1 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 1 illustrates the electronic assembly as part of a desktop computer. FIG. 1 shows electronic assembly 100 including die 110, physically and electrically connected to package substrate 120. Die 110 is an integrated circuit die, such as a microprocessor die, having, for example, transistor structures interconnected or connected to power/ground or input/output signals external to the die through interconnect lines to contacts 130 on an external surface of die 110. Contacts 130 may be aligned with contacts 140 making up, for example, a die bump layer on an external surface of package substrate 120. On a surface of package substrate 120 opposite a surface including contacts 140 are land contacts 150. Connected to each of land contacts 150 are solder bumps 160 that may be used to connect package 170 to circuit board 180, such as a motherboard or other circuit board.

Figure 2:
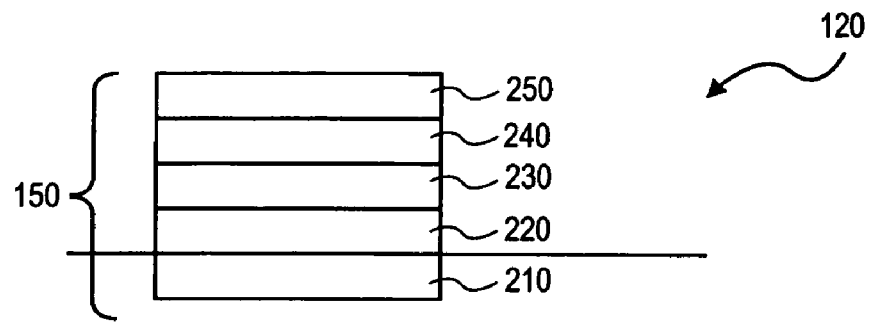
FIG. 2 shows a schematic cross-sectional side view of a land on a package substrate.
Figure 3:
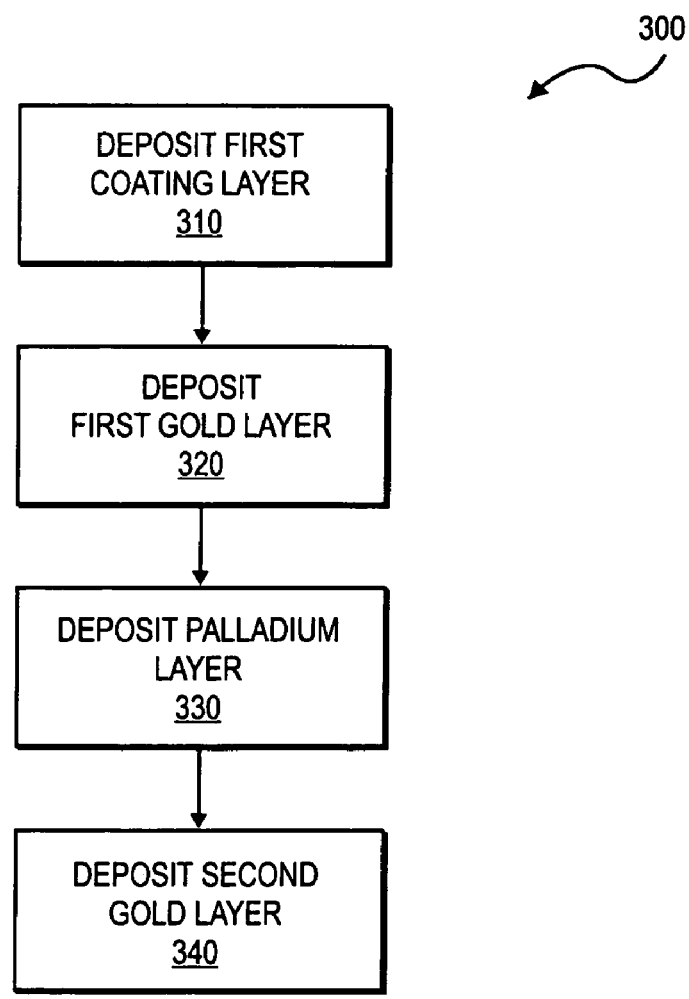
FIG. 3 shows a flow chart for forming coating layers on a land of a package substrate.

FIG. 2 shows an example of one of the land contacts of the package substrate of FIG. 1. FIG. 3 describes a representative process flow for forming coating layers on a contact. Referring to FIG. 2, package substrate 120 includes land contacts 150 each of which includes contact 210 formed in or on package substrate 120 as a contact point. Contact 210 has a number of coating layers overlying a surface (a top surface as viewed). In one embodiment, contact 210 is an electrically conductive material such as copper or an alloy of copper. Contact 210 may be separated by adjacent contacts on package substrate 120 through a dielectric material, such as a polymer (e.g., polyimide) material.

Overlying a surface of contact 210 (a top surface as viewed) is first coating layer 220. In an embodiment where contact 210 is a copper material, first coating layer 220 is a nickel material formed. Referring to the process flow in FIG. 3, process 300 includes depositing a first coating layer such as a nickel material on a land contact of a package substrate, such as land contact 210 of package substrate 120 (block 310). One technique for depositing a first coating layer of a nickel material onto a contact of a copper material is through an electroless deposition process.

Overlying first coating layer 220 in the structure of FIG. 2 is layer 230. Layer 230 is selected, in one embodiment, of a material of gold. The process flow described in FIG. 3 includes depositing a first gold layer on the first coating layer (block 320). One technique for depositing a gold material is through an electroplating process.

Overlying layer 230 in the structure shown in FIG. 2 is layer 240 of, in one embodiment, a palladium material. Process 300 of FIG. 3 includes depositing palladium layer on first gold layer (block 330). In one embodiment, palladium is deposited through an electroplating process.

The depositing of palladium is followed by a deposition of a second gold layer (block 340, FIG. 3). In one embodiment, the second gold layer is deposited by an electroplating process. FIG. 2 shows overlying layer 250 of a material of gold overlying layer 240. Thus, the structure shown in FIG. 2 includes layer 240 sandwiched or disposed between layer 230 and layer 250 of a material of gold.

In one embodiment, a coating of nickel (Ni)/gold (Au)/palladium (Pd) is deposited to the following thicknesses: Ni 5.6 microns; Au 0.025 micron; Pd 0.08 micron; Au 0.06 micron. A total thickness of the composite coating in this example, is 5.75 microns. If this composite coating is compared to a prior art coating utilizing 5.6 microns nickel, 0.8 microns palladium, and 0.6 micron gold for a composite thickness of 5.73 microns, a prediction on a resistance of the composite stacks would be the stack with the additional gold layer would have a higher resistance as a thicker stack. However, although an overall resistance might be predicted to be higher, it has been found that an electronic structure (e.g., a work function) of the metal is such that tunneling of electrons through the composite stack is easier when the palladium material is sandwiched between gold layers as described.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
forming a coating on a land contact of a package substrate configured to connect to a circuit die, the land contact comprising copper, the coating comprising a first material disposed between a first layer and a second layer, and each of the first layer and the second layer being made of a second material comprising gold.

2. A method comprising:
forming a first coating on a land contact of a package substrate, the land contact comprising copper; and
forming a second coating on the land contact comprising a first material disposed between a first layer and a second layer, each of the first layer and the second layer being made of a second material comprising gold.

3. The method of claim 2, wherein the first coating comprises nickel.

4. The method of claim 2, wherein the first material comprises palladium and the coating is a second coating, the method further comprising:
prior to forming the second coating, forming a first coating comprising nickel.

5. The method of claim 2, wherein forming a first coating comprises electrodepositing the first layer and the second layer.

6. The method of claim 5, wherein electrodepositing comprising electroplating.

7. An apparatus comprising:
a package substrate configured to connect to a circuit die, the package substrate comprising a plurality of land contacts comprising copper, wherein each of the plurality of land contacts comprises a first coating and a second coating, the second coating comprising a first material disposed between a first layer and a second layer, and wherein the first coating is disposed between the second coating and the land contact each of the first layer and the second layer being made of a second material comprising gold.

8. The apparatus of claim 7, wherein the first coating comprises nickel.

9. The apparatus of claim 7, wherein the first material comprises palladium.

10. The apparatus of claim 7, wherein the plurality of contacts comprise a first plurality of contacts on a first side of the package substrate, the package substrate further comprises a plurality of second contacts on a second opposite side of the package substrate, the apparatus further comprising:
a chip coupled to the plurality of second contacts.

11. A system comprising:
a computing device comprising:
a microprocessor;
a printed circuit board; and
a substrate, wherein the microprocessor is coupled to the printed circuit board through the substrate, the substrate comprising a plurality of land contacts comprising copper, wherein each of the plurality of land contacts comprises a first coating and a second coating, the second coating comprising a first material disposed between a first layer and a second layer, and wherein the first coating is disposed between the second coating and the land contact each of the first layer and the second layer being made of a second material comprising gold.

12. The system of claim 11, wherein the first coating comprises nickel.

13. The system of claim 12, wherein the first material comprises palladium.

* * * * *